United States Patent
Huott et al.

(10) Patent No.: US 7,355,460 B2
(45) Date of Patent: *Apr. 8, 2008

(54) METHOD FOR LOCALLY GENERATING NON-INTEGRAL DIVIDED CLOCKS WITH CENTRALIZED STATE MACHINES

(75) Inventors: William V. Huott, Holmes, NY (US); Charlie C. Hwang, Hopewell Junction, NY (US); Timothy G. McNamara, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 127 days.

This patent is subject to a terminal disclaimer.

(21) Appl. No.: 11/341,038

(22) Filed: Jan. 27, 2006

(65) Prior Publication Data

US 2007/0176652 A1    Aug. 2, 2007

(51) Int. Cl.
*G06F 1/04* (2006.01)
(52) U.S. Cl. .................................. 327/115; 327/291
(58) Field of Classification Search .............. 327/115, 327/117, 291–299; 377/47, 48
See application file for complete search history.

(56) References Cited

U.S. PATENT DOCUMENTS

| | | | |
|---|---|---|---|
| 5,416,443 A | 5/1995 | Cranford, Jr. et al. | 331/2 |
| 5,596,765 A | 1/1997 | Baum et al. | 395/800 |
| 5,926,053 A * | 7/1999 | McDermott et al. | 327/298 |
| 6,134,670 A | 10/2000 | Mahalingaiah | 713/401 |
| 6,272,646 B1 | 8/2001 | Rangasayee | 713/500 |
| 6,326,812 B1 | 12/2001 | Jefferson | 326/93 |
| 6,550,013 B1 | 4/2003 | Gervais et al. | 713/501 |
| 6,583,648 B1 | 6/2003 | Cai | 326/93 |
| 6,611,920 B1 | 8/2003 | Fletcher et al. | 713/322 |
| 7,129,764 B2 | 10/2006 | Huott et al. | |

OTHER PUBLICATIONS

Japanese Patent, "Patent Abstracts of Japan", (C) 1994, JPO & Japio.

* cited by examiner

*Primary Examiner*—N. Drew Richards
*Assistant Examiner*—Thomas J. Hiltunen
(74) *Attorney, Agent, or Firm*—Cantor Colburn LLP; Lynn Augspurger

(57) ABSTRACT

A method for locally generating a ratio clock on a chip includes generating a global clock signal having a global clock cycle. A centralized state machine is provided that includes a counter going through a complete cycle in response to a non-integer number of global clock cycles, the centralized state machine generating a control signal in response to the counter. The control signal is provided to staging latches, the staging latches generating a clock high signal and a clock low signal, the clock high and clock low signal having patterns derived from a waveform of a target divided ratio clock and the clock high and clock low signals have patterns that match the targeted divided clock frequency and duty cycle. Local pass gate are provided for generating an (n+0.5)-to-1 clock signal in response to the global clock signal, the clock high signal and the clock low signal.

8 Claims, 8 Drawing Sheets

CENTRALIZED STATE MACHINE

CENTRALIZED STATE MACHINE AND STAGING LATCHES

PARTIALLY CENTRALIZED STAGING LATCHES

PARTIALLY CENTRALIZED STATE MACHINE AND STAGING LATCHES

PARTIALLY CENTRALIZED STATE MACHINE AND STAGING LATCHES WITH A HIERARCHY

PARTIALLY CENTRALIZED STATE MACHINE

Figure 6: Determine clkl and clkh

METHOD FOR LOCALLY GENERATING NON-INTEGRAL DIVIDED CLOCKS WITH CENTRALIZED STATE MACHINES

This application is related to U.S. patent application, filed concurrently with this patent application, entitled "Circuit for Locally Generating Non-Integral Divided Clocks with Centralized State Machines," Ser. No. 11/341,032, having William V. Huott, Charlie C. Hwang and Timothy G. McNamara and as named inventors, the entire contents of which are incorporated herein by reference.

BACKGROUND OF THE INVENTION

1. Field of the Invention

This invention relates to generating a ratio clock signal using a global clock signal. More particularly, this invention relates to generating a ratio clock signal at any integer divided by two of a global clock signal.

2. Description of Background

It is common for an integrated circuit chip (chip) to operate with multiple different clock speeds. Often, chip architecture allows different regions of the chip to have different clock speeds. To achieve multiple different clock speeds, a chip may employ multiple clock grids throughout the entire chip with each clock grid producing a distinct clock speed. However, employing multiple clock grids creates additional expense for chip production. Higher clock skews between clocks of different clock grids may reduce the maximum clock speed and reduce chip performance. Thus, to keep costs down and keep chip performance up, it has been common practice to use a single clock grid to generate a global clock and obtain different clock speeds by developing ratio clock speeds at a specific ratio to the global clock.

It is common to use external control signals to develop derivative clock speeds at a ratio to the global clock. Additionally, absent external control signals, derivative clock speeds are generally limited to having whole number ratios to the global clock of, for example, 2-to-1, 4-to-1, etc. Generally, there is known in the art circuits which centrally generate clocks with multiple frequencies or phases with multiple phase locked loops, and which use an integral divider. Additionally, complex circuits used to generate derivative clock speeds may create a time delay between the global clock and the derivative clock.

An existing solution is provided in U.S. patent application Ser. No. 11/056,024, the entire contents of which are incorporated herein by reference. This application describes a circuit and power device for a local state machine, which while well suited for its intended purpose, is primarily effective when there are only a few local circuits. However, there are embodiments where a high number of circuits use a non-integral divided clock locally. Thus, there is a need for a more compact solution than that described in U.S. patent application Ser. No. 11/056,024.

SUMMARY OF THE INVENTION

Embodiments include a method for locally generating a ratio clock on a chip includes generating a global clock signal having a global clock cycle. A centralized state machine is provided that includes a counter going through a complete cycle in response to a non-integer number of global clock cycles, the centralized state machine generating a control signal in response to the counter. The control signal is provided to staging latches, the staging latches generating a clock high signal and a clock low signal, the clock high and clock low signal having patterns derived from a waveform of a target divided ratio clock, the clock high and clock low signals have patterns that match the targeted divided clock frequency and duty cycle. Local pass gate are provided for generating an (n+0.5)-to-1 clock signal in response to the global clock signal, the clock high signal and the clock low signal.

Embodiments further include a method for locally generating a ratio clock including generating a global clock signal having a global clock cycle. A centralized clock control unit is provided and includes a first state machine and a second state machine, the first state machine including a counter going through a complete cycle in response to a non-integer number of global clock cycles, the first state machine generating a generating a clock high signal having a pattern corresponding to a target divided ratio clock when the global clock is high. The second state machine includes a counter going through a complete cycle in response to a non-integer number of global clock cycles, the second state machine generating a generating a clock low signal having a pattern corresponding to the target divided ratio clock when the global clock is low. A local pass gate is provided for generating an (n+0.5)-to-1 clock signal in response to the global clock signal, the clock high signal and the clock low signal.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which centralizes or partially centralizes one or more state machines to provide a method of generating ratio clocks while reducing circuitry used at the local circuit level. Further, staging latches may be centralized or partially centralized to reduce circuitry used at the local circuit level. The frequency and duty cycle of a locally generated ratio clock may be dynamically changed by reconfiguring the central state machines.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
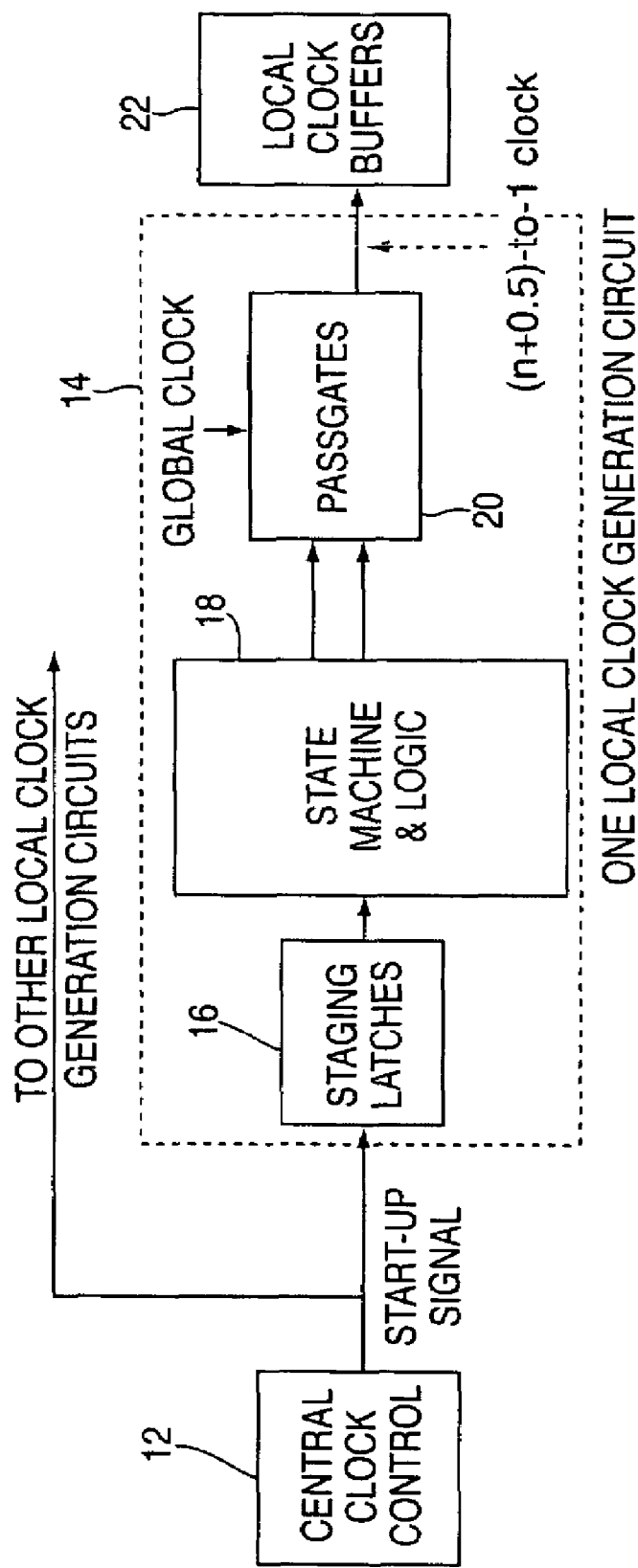
FIG. 1 illustrates a block diagram of an existing ratio clock generator.

FIG. 1 illustrates a block diagram of an existing ratio clock generator, such as that described in U.S. patent application Ser. No. 11/056,024. FIG. 1 shows a centralized clock control 12 that provides a start-up signal to a local clock generation circuit 14. The local clock generation circuit 14 includes staging latches 16, state machine and logic 18 and pass gates 20. The output of the pass gates 20 is the (n+0.5)-to-1 clock signal. Local clock buffers 22 store the clock signals for local devices.

The existing solution shown in FIG. 1 uses local state machines 18. The methods used in embodiments of the invention described with reference to FIGS. 2-7 centralize the state machine to allow sharing of the generally large state machine circuits among all clock generation circuits. As described herein, by centralizing the state machine, a more sophisticated state machine may be used with no or less impact on local circuit sizes.

Figure 2:
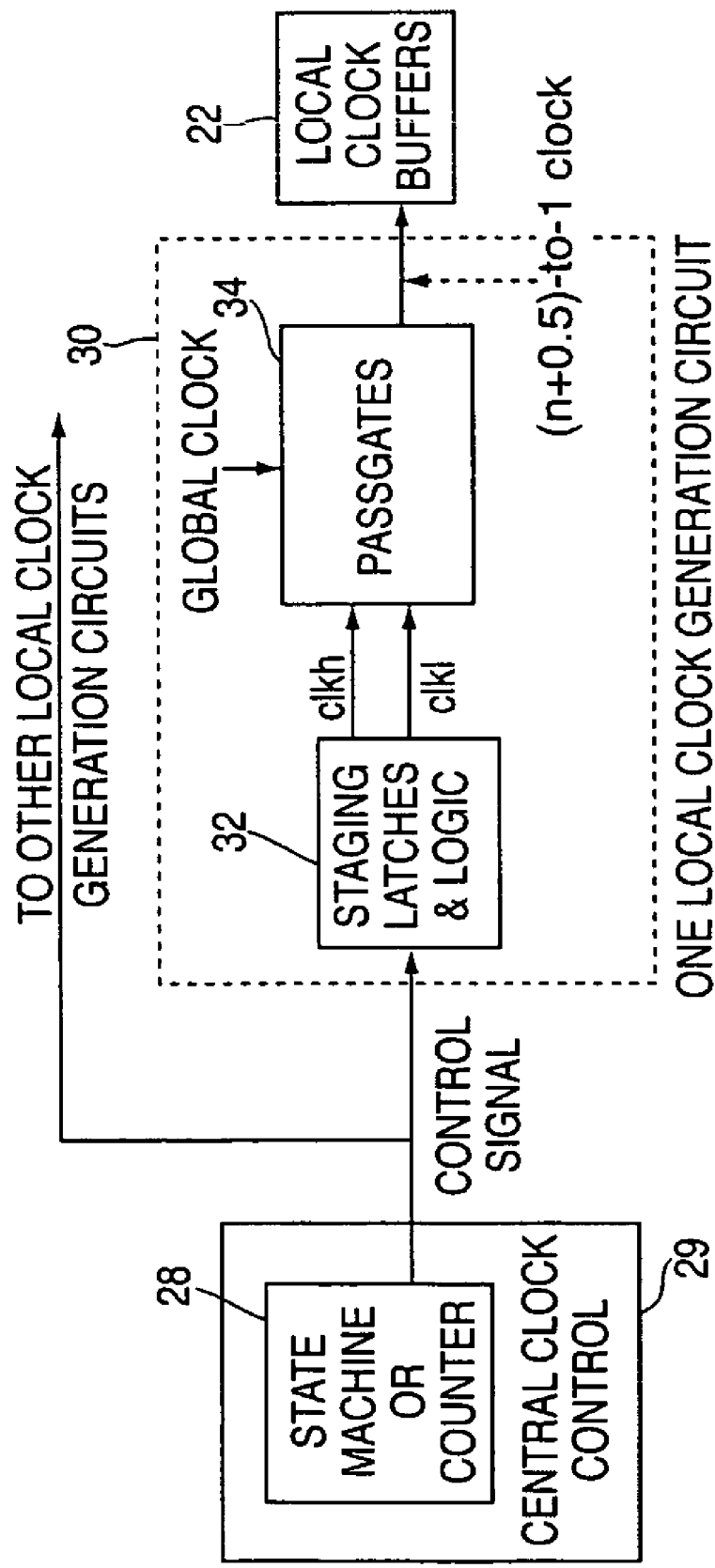
FIG. 2 illustrates one example of the method of centralizing the state machine part of the circuit to one central control unit of the chip.

FIG. 2 illustrates one example of the method of centralizing the state machine 28 of the circuit to one central control unit of the chip. The state machine 28 employs counters to increment logic states as described in U.S. patent application Ser. No. 11/056,024. In exemplary methods, the state machine creates a "count-to-three counter" that counts in binary, for example, 0, 1, 2, 0, 1, etc. The count-to-three counter passes through (counts) three incremental logic states twice during three complete clock cycles of a global clock. Therefore, the output of the count-to-three counter goes through a complete cycle every one and one-half global clock cycles (or a 1.5-to-1 ratio). In general, the control signal can have a non-integer number of cycles in response to a single global clock cycle.

Figure 8:
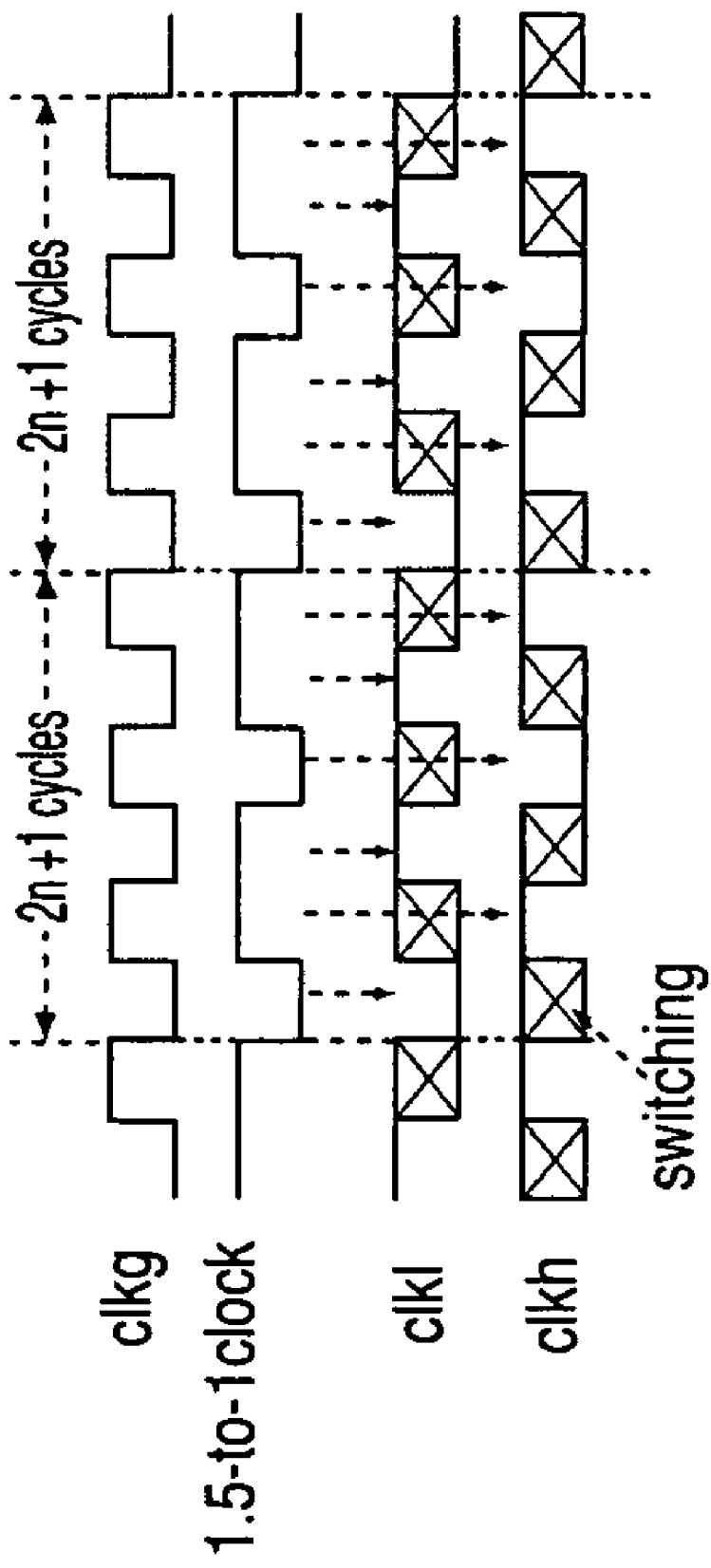
FIG. 8 illustrates various signals generated in embodiments of the invention.

State machine 28 provides a control signal to a local clock generation circuit 30. As evident from FIG. 2, exemplary methods centralize the state machine 28, to provide less complex local circuits. The control signal from the centralized state machine 28 may be provided to multiple local clock generation circuits 30. Local clock generation circuit 30 includes staging latches and logic 32 that generate a clock high signal (clkh) and a clock low signal (clkl) as shown in FIG. 8. The staging latches 32 are used to synchronously capture the control signals and to work with the associated logic to generate target ratio clocks. The timing information (e.g., frequency, duty cycle) is carried by the control signals from the state machine.

FIG. 8 depicts the global clock signal clkg. The staging latches 32 operate to generate the clock high signal and the clock low signal, examples of which are shown in FIG. 8. As shown in FIG. 8, the clock high signal, clkh, is passed through the final passgate when clkg is high, while clock low signal, clkl, is passed through when clkg is low. The required pattern to generate clkh and clkl may be determined from the target frequency and duty cycle of the divided ratio clock. In the example shown in FIG. 8 for a 1.5-to-1 66.7% duty cycle ratio clock. The data pattern for clkl will be 011, while clkh will have 101. Both repeat every 3 cycles. Once clkl and clkh patterns are determined, any conventional logic design methods may be used to design the circuits for the central state machine and the logic in local clock generation circuits. Additional details of the staging latches are provided in the above-reference related application filed contemporaneously with this application.

By using this method of determining clkh and clkl signals, theoretically a ratio clock with any waveform and duty cycle may be generated by generating corresponding clkl and clkh patterns.

The clock high signal and the clock low signal are provided to pass gates 34 to generate the (n+0.5)-to-1 clock signal. In the example shown in FIG. 8, the (n+0.5)-to-1 clock signal is a 1.5-to-1 clock signal. To generate the (n+0.5)-to-1 clock, the global clock signal is used by pass gates 34 to select either the clock high signal or the clock low signal in response to the state of the global clock signal. FIG. 8 depicts how the (n+0.5)-to-1 clock signal is formed from sections of the clock high signal clkh and clock low signal clkl. The (n+0.5)-to-1 clock signal is provided to local clock buffers 22. For circuits that are sensitive to sizes, the size of local clock generation circuit 30 may be reduced further by centralizing the staging latches 32 into central clock control unit 29.

Figure 3:
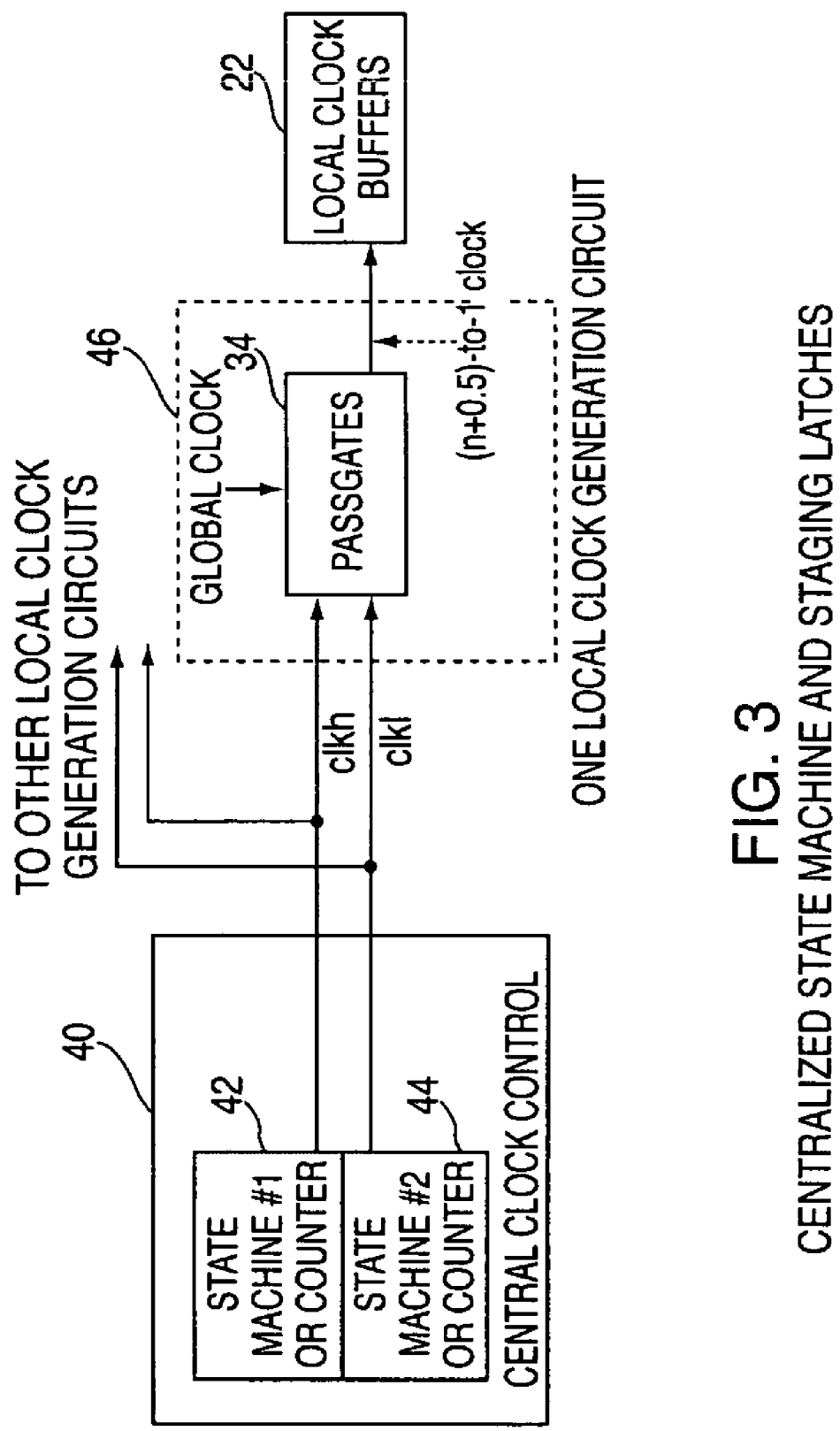
FIG. 3 illustrates one example of the method of completely centralizing the state machine and staging latches for the whole chip.

FIG. 3 illustrates an alternate method of generating the (n+0.5)-to-1 clock signal. In these methods, generation of the clock high signal clkh and the clock low signal clkl is centralized in two state machines 42 and 44. Two state machines 42 and 44 with individual configuration cooperate to generate two signal patterns, clkl, and clkh to achieve the desired ratio clock at the local circuit. This eliminates the need for staging latches in the local clock generation circuit 46 to reduce the size of the local clock generation circuitry. The signal pattern of clkl and clkh may be dynamically reconfigured to achieve a different local ratio clock without changing local circuitry.

Figure 4:
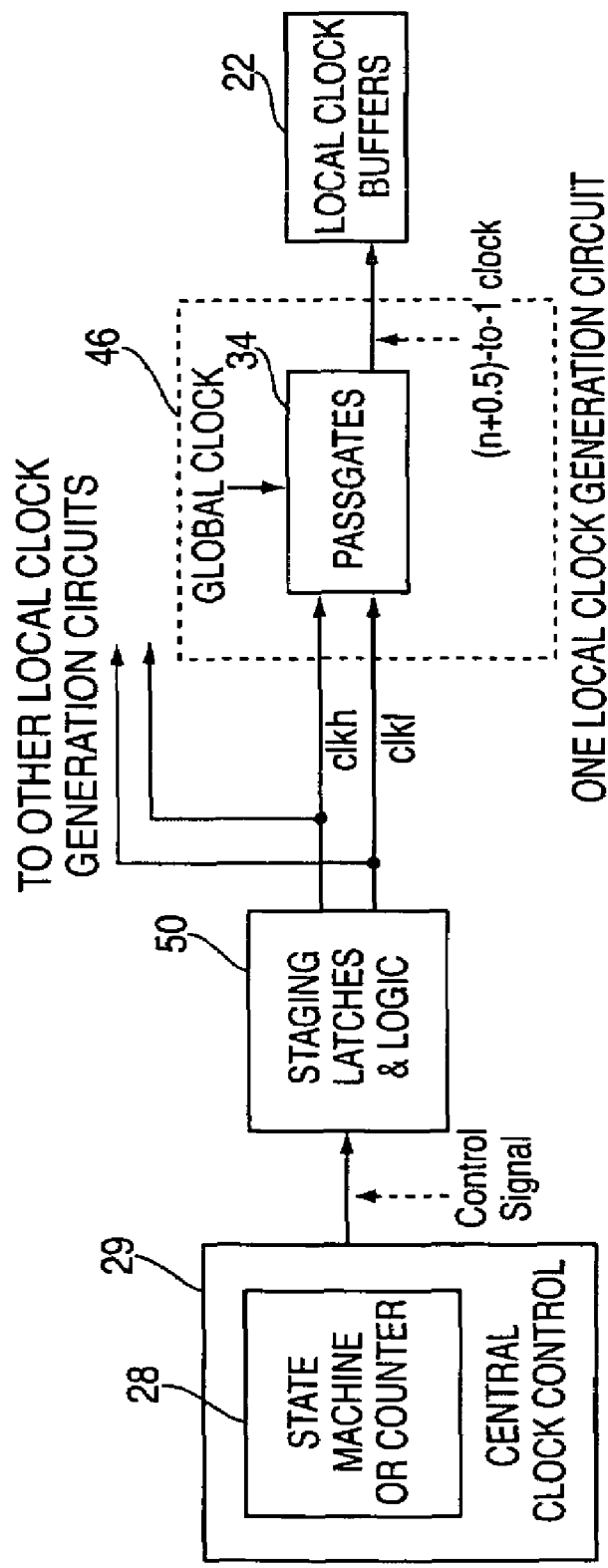
FIG. 4 illustrates one example of the method of completely centralizing the state machine and partially centralizing the staging latches.

FIG. 4 illustrates an alternate method of generating the (n+0.5)-to-1 clock signal. Instead of centralizing the state machines and staging latches completely, multiple copies of the staging latches 50 may be placed strategically on the chip between the central clock control 29 and local clock generation circuits 46 and shared by a group of clock generation circuits 46 to reduce the cost of distributing high speed control signals or the "clkh" & "clkl" signals. FIG. 4 shows the case that the state machine 28 is centralized but the staging latches and logic 50 are partially centralized. The staging latches 50 will serve local clock buffers of the same clock frequency.

Figure 5:
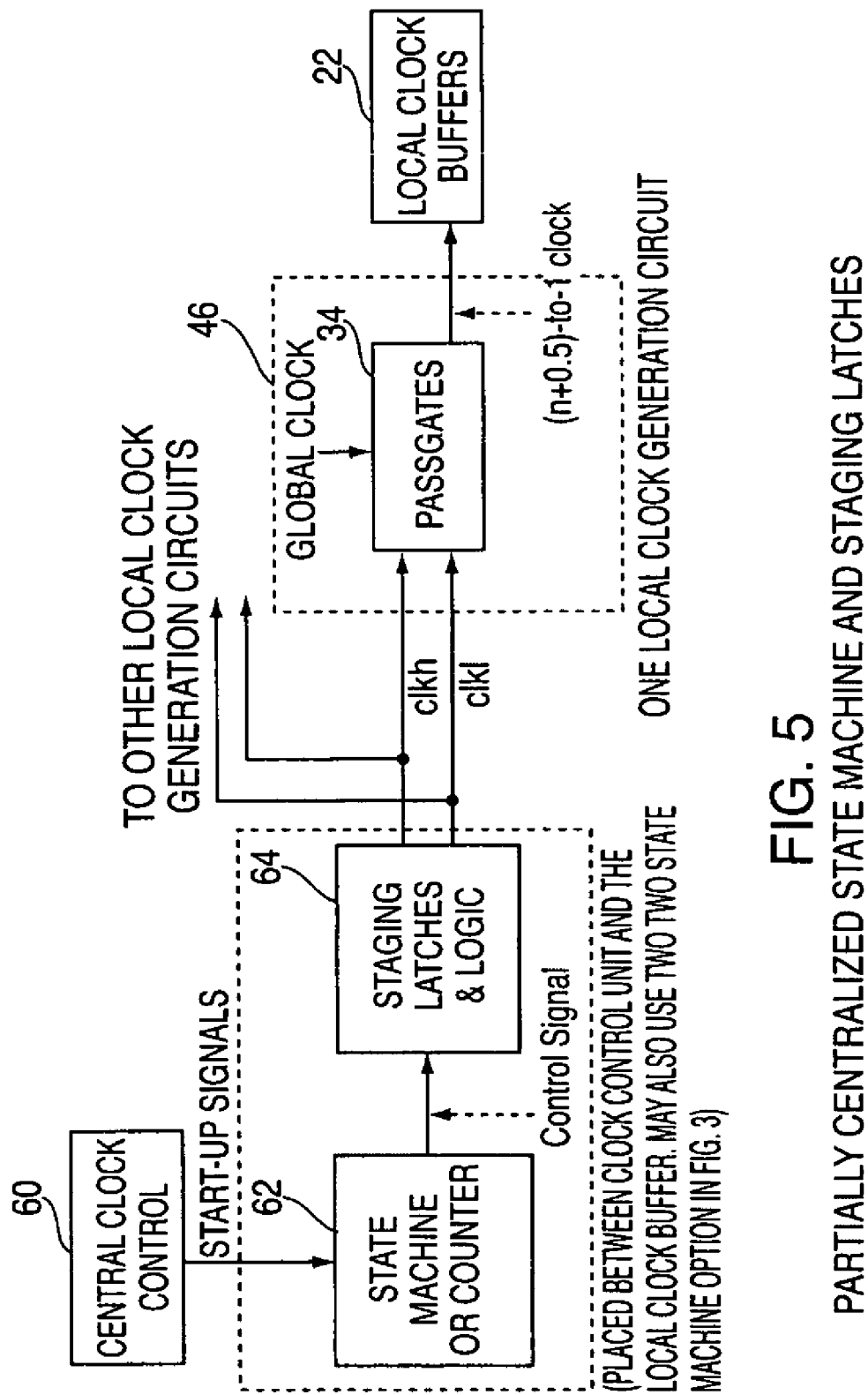
FIG. 5 illustrates one example of the method of partially centralizing state machines and staging latches.

FIG. 5 illustrates an alternate method of generating the (n+0.5)-to-1 clock signal. In FIG. 5, a centralized clock control 60 provides start-up signals to multiple copies of state machine 62 and staging latches 64. FIG. 5 shows the case that both state machine 62 and staging latches 64 are both partially centralized, meaning that multiple instances of the state machine 62 and staging latches 64 are provided on the chip. One set of state machine 62 and staging latches 64 may be used to serve a larger region on the chip.

Figure 6:
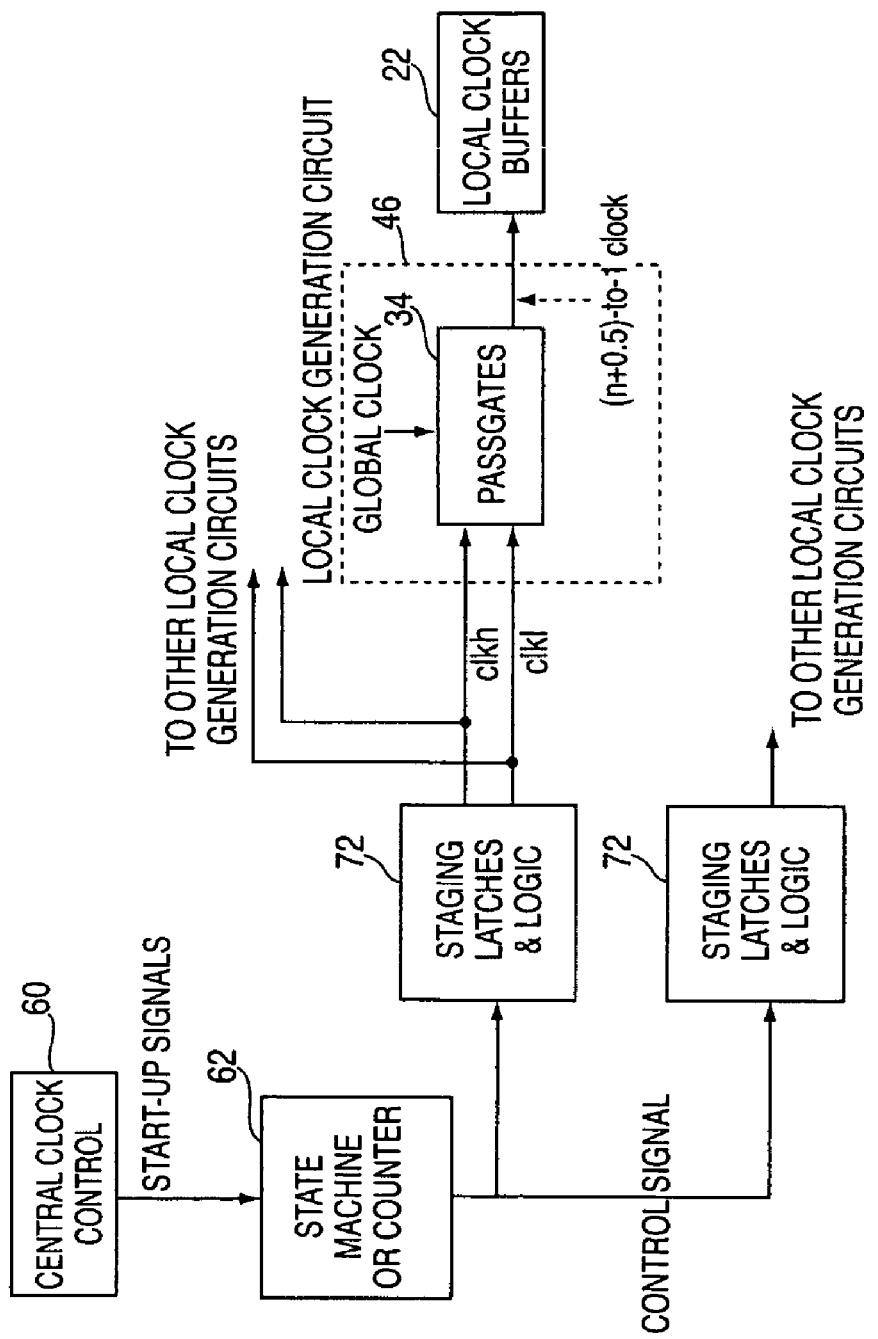
FIG. 6 illustrates one example of the method of hierarchically arranging partially centralized state machines and staging latches.

FIG. 6 illustrates an alternate method of generating the (n+0.5)-to-1 clock signal. As shown in FIG. 6, the state machine 62 and staging latches 72 may be separated to create a hierarchy. One state machine 62 may serve multiple staging latches 72 which may be at different locations. Again, as described with reference to FIG. 5, multiple state machines 62 may be used to cover different regions of the chip. Also, the staging latches 72 are associated with more than one local clock generation circuit 46 so that in general, there are more staging latches 72 than state machines 62.

Figure 7:
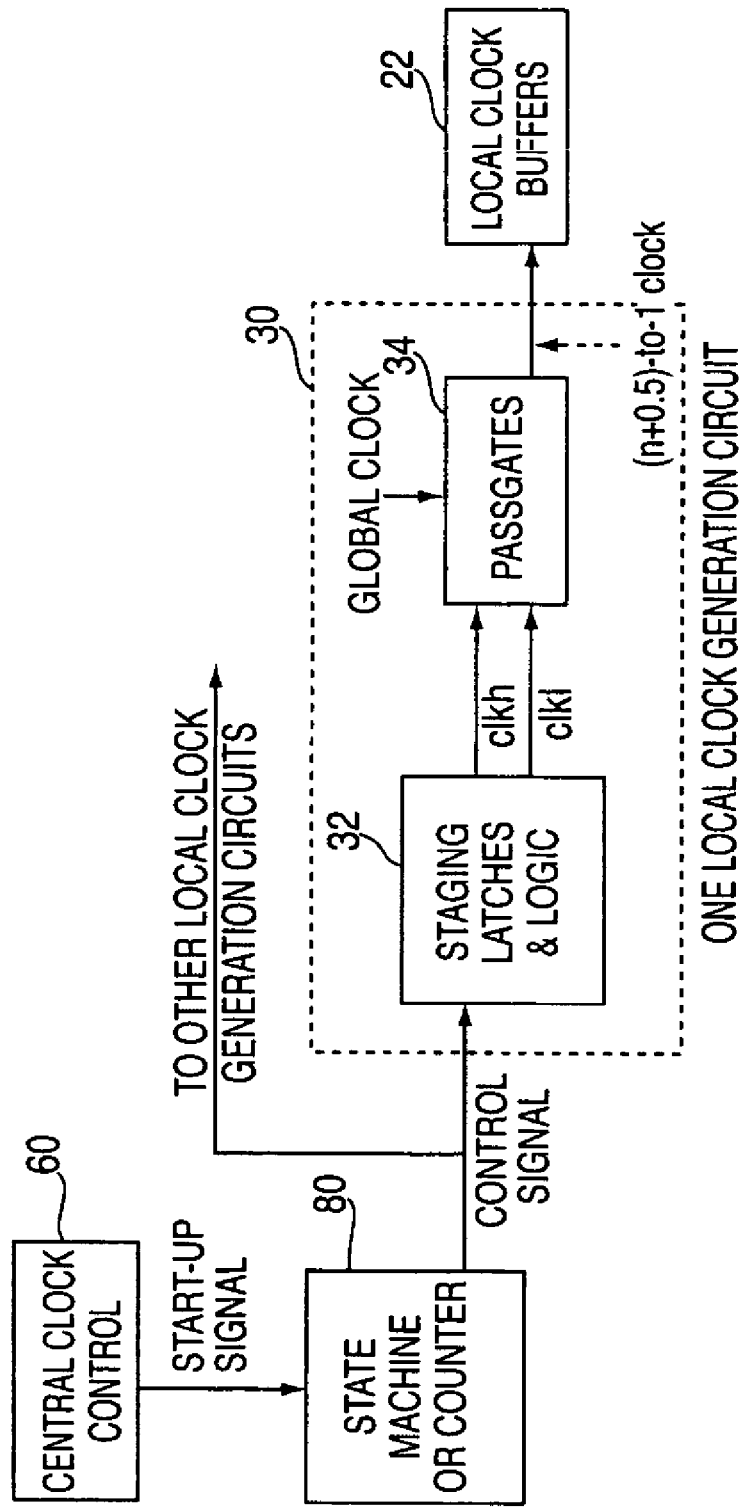
FIG. 7 illustrate one example of the method of only partially centralizing the state machine.

FIG. 7 illustrates an alternate method of generating the (n+0.5)-to-1 clock signal. In FIG. 7, the local clock generation circuits include staging latches 32 and pass gates 34 as described above. The state machine 80 that generate the control signal pattern may be the only component that is partially centralized such that multiple state machines are used to cover different regions of the chip.

FIGS. 2-7 depict various solutions, one of which may be selected depending on the amount and distribution of the circuits that need a particular (n+0.5)-to-1 clock. Trade-off among all possible solutions can be analyzed based on chip and macro floorplan. Some general guidelines are as follows.

A mixture of the various solutions depicted in FIGS. 2-7 and the one described in U.S. patent application Ser. No. 11/056,024 may also be used by employing different solution for different regions of the chip depending on the nature of each region and amount local clock generation circuits used.

For higher n, (e.g., n=2 and above), it will beneficial to either completely or partially centralize the state machine and staging latches since the required number of latches for both the state machine and the staging latches is proportional to n. If the circuits that required (n+0.5)-to-1 clock are localized in one area, it may be better to have a partially centralized state machine and staging latches to save the cost of distributing high speed control signal across the chip. If the circuits that require (n+0.5)-to-1 clock are abundant and distributed over a large area of the chip, completely centralized state machines and staging latches may be best solution. If only a few circuits on a chip require (n+0.5)-to-1 clock, a localized state machine and staging latches may be the best solution.

Methods of the invention avoid a bulky local state machine and staging latches to achieve small and compact local clock generation circuit to improve area usage, timing, and power. Methods of the invention allow flexible control of frequency and duty cycle from centralized clock control unit.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for locally generating a ratio clock on a chip, comprising:
   generating a global clock signal having a global clock cycle;
   providing a centralized state machine, the centralized state machine including a counter going through a complete cycle in response to a non-integer number of global clock cycles, the centralized state machine generating a control signal in response to the counter;
   providing the control signal to staging latches, the staging latches generating a clock high signal and a clock low signal, the clock high and clock low signal having patterns derived from a waveform of a target divided ratio clock, the clock high and clock low signals have patterns that match the targeted divided clock frequency and duty cycle;
   providing local pass gate for generating an (n+0.5)-to-1 clock signal in response to the global clock signal, the clock high signal and the clock low signal.

2. The method of claim 1, wherein the clock low signal and clock high signal are determined from a target ratio clock.

3. The method of claim 1 wherein the staging latches are localized staging latches being part of local clock generation circuits.

4. The method of claim 1 wherein the staging latches are partially centralized staging latches providing the clock high signal and the clock low signal to a plurality of local clock generation circuits.

5. The method of claim 1 wherein the state machine and the staging latches are partially centralize such that each state machine and staging latches providing the clock high signal and the clock low signal to a portion of local clock generation circuits on the chip.

6. The method of claim 1 wherein the state machine and the staging latches are arranged in a hierarchy, the state machine providing control signals to a plurality of partially centralized staging latches, each staging latch providing the clock high signal and the clock low signal to a portion of local clock generation circuits on the chip.

7. The method of claim 1 wherein the staging latches are localized staging latches being part of local clock generation circuits and the state machine is partially centralized such that multiple state machines provide control signals to groups of local clock generation circuits.

8. The method of claim 2 wherein the frequency and duty cycle of the ratio clock may be dynamically changed without changing the designs of local circuiting by selecting patterns for the clock low signal and the clock high signal.

* * * * *